(12) United States Patent
Cheung et al.

(10) Patent No.: US 6,542,662 B2
(45) Date of Patent: Apr. 1, 2003

(54) MODE TRANSLATING WAVEGUIDE ADAPTER FOR A QUASI-OPTIC GRID ARRAY

(75) Inventors: Chun-Tung Cheung, Pasadena, CA (US); David B. Rutledge, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/876,212

(22) Filed: Jun. 5, 2001

(65) Prior Publication Data

US 2002/0021865 A1 Feb. 21, 2002

Related U.S. Application Data

(60) Provisional application No. 60/211,252, filed on Jun. 13, 2000.

(51) Int. Cl.[7] .................................................. G02B 6/26
(52) U.S. Cl. ........................................ 385/28; 385/147
(58) Field of Search ...................................... 385/24, 28

(56) References Cited

U.S. PATENT DOCUMENTS

| | | | | |
|---|---|---|---|---|
| 2,617,937 A | * | 11/1952 | Van Atta | 333/21 R |
| 4,757,326 A | * | 7/1988 | Profera, Jr. | 343/772 |
| 5,317,173 A | | 5/1994 | Sovero | 257/197 |

OTHER PUBLICATIONS

M. A. Ali, et al., "Analysis and Measurement of Hard–Horn Feeds for the Excitation of Quasi–Optical Amplifiers," *IEEE Transactions on Microwave Theory and Techniques*, vol. 47, No. 4, pp. 479–487, Apr., 1999.

M. Kim, et al., "A Rectangular TEM Waveguide with Photonic Crystal Walls for Excitation of Quasi–Optical Amplifiers," *IEEE MTT–S Int. Microwave Symp.*, pp. 543–546, Jun. 1999.

F–R. Yang, et al., "A Novel TEM Waveguide Using Uniplanar Compact Photonic–Bandgap (UC–PBG) Structure," *IEEE Transactions on Microwave Theory and Techniques*, vol. 47, No. 11, pp. 2092–2098, Nov. 1999.

* cited by examiner

Primary Examiner—Akm E. Ullah
(74) Attorney, Agent, or Firm—Fish & Richardson P.C.

(57) ABSTRACT

The present invention discloses a simple adapter that transitions between a standard rectangular waveguide environment and the quasi-plane wave (quasi-TEM mode) environment of an active grid array assembly. The device may serve as a mode expanding waveguide feed or as a mode contracting waveguide collector.

27 Claims, 2 Drawing Sheets

MODE TRANSLATING WAVEGUIDE ADAPTER FOR A QUASI-OPTIC GRID ARRAY

CROSS-REFERENCE TO RELATED APPLICATIONS

This application claims the benefit of U.S. Provisional Application No. 60/211,252, filed on Jun. 13, 2000.

STATEMENT AS TO FEDERALLY SPONSORED RESEARCH

The U.S. Government may have certain rights in this invention pursuant to ARO Grant No. DAA G55-98-1-0001 awarded by the U.S. Army.

BACKGROUND OF THE INVENTION

1. Field of the Invention

This invention relates to quasi-optic grid arrays, such as periodic grid arrays, and in particular to techniques for adapting a waveguide to a quasi-optic grid array.

2. Description of Related Art

Broadband communications, radar and other imaging systems require the transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, spatial power combining using "quasi-optics" was proposed as a potential solution to these problems. The theory was that an array of microwave or millimeter-wave solid state sources placed in a resonator could synchronize to the same frequency and phase, and their outputs would combine in free space, minimizing conductor losses. Furthermore, a planar array could be fabricated monolithically and at shorter wavelengths, thereby enabling potentially thousands of devices to be incorporated on a single wafer.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the field has been explosive.

It is believed that the first quasi-optical grid array amplifier was a grid developed by M. Kim et al. at the California Institute of Technology. This grid used 25 MESFET differential pairs, demonstrating a gain of 11 dB at 3 GHz. As shown in FIG. 1, a typical grid amplifier 10 is an array of closely-spaced differential pairs of transistors 14 on an active grid 12 sandwiched between an input and output polarizer, 18, 24. An input signal 16 passes through the horizontally polarized input polarizer 18 and creates an input beam incident from the left that excites rf currents on the horizontally polarized input antennas 20 of the grid 12. These currents drive the inputs of the transistor pair 14 in the differential mode. The output currents are redirected along the grid's vertically polarized antennas 22, producing a vertically polarized output beam 30 via an output polarizer 24 to the right.

The cross-polarized input and output affords two important advantages. First, it provides good input-output isolation, reducing the potential for spurious feedback oscillations. Second, the amplifier's input and output circuits can be independently tuned using metal-strip polarizers, which also confine the beam to the forward direction. Numerous grid amplifiers have since been developed and have proven thus far to have great promise for both military and commercial RF applications and particularly for high frequency, broadband systems that require significant output power levels (e.g. >5 watts) in a small, preferably monolithic, package. Moreover, a resonator can be used to provide feedback to couple the active devices to form a high power oscillator.

Grids amplifiers can be characterized as quasi-plane wave input, quasi-plane wave output (free space) devices. Grid oscillators are essentially quasi-plane wave output devices. However, most microwave and millimeter wave systems transport signals through electrical waveguides, which are devices that have internal wave-guiding cavities bounded by wave-confining, and typically metal, walls. Consequently, an interface between the two environments is needed in most cases. This interface is needed whether the electric field signal is being output from a waveguide for effective application to the grid array; or the free space output signal of a grid array is to be collected into a waveguide.

Providing such an interface is not a trivial matter for several reasons. First, microwave and millimeter wave waveguides conventionally transmit signals in the single transverse electric (TE) mode, also known as the fundamental, or $TE_{10}$, mode, and block the higher-order mode components of the signal. These conventional waveguides have a standard, constant size and rectangular shape. However, the input plane area of any typical grid array upon which the input signal is incident may be much larger than the area of the standard rectangular waveguide aperture. Furthermore, as noted, grid array assemblies comprising N by N unit cells and bounded by a dielectric (see FIG. 2) will vary in size depending number of cells in the grid and the dielectric size. Thus, a standard waveguide cannot directly mate with a grid array structure.

Moreover, the standard single mode rectangular waveguide operating in $TE_{10}$ mode provides an electric field distribution that varies sinusoidally in amplitude across it aperture. However, efficient operation of grid amplifiers requires an excitation beam that has a relatively uniform phase and magnitude distribution across the amplifier's area.

Several groups have attempted to design waveguides that interface with quasi-optic active devices, but have had only limited success. For example, Yang, et al. recently published an article titled "A Novel TEM Waveguide using Unipolar Compact Photonic-Bandgap ", *IEEE Trans. On Microwave*

*Theory and Tech.*, Vol. 48, No. 2, pp. 2092–2098, November, 1999. Further, Ali, et al. published an article titled, "Analysis and Measurement of Hard-Horn Feeds for the Excitation of Quasi-Optic Amplifiers," *IEEE Trans. On Microwave Theory and Tech.*, Vol. 47, No. 4, pp. 479–487, April, 1999. Unfortunately, these proposed techniques do not adequately resolve the aforementioned problems. For example, the photonic bandgap structures described by Yang et al. are very difficult and costly to manufacture, making this technique less than desirable. Moreover, the "hard-horn" approach of Ali et al. creates a rather large and bulky structure that is impractical for most commercial applications.

Thus, there is a definite need for a simple and cost effective interface, or adapter, that efficiently couples a waveguide that propagates signals in the fundamental mode to a grid array structure with a desired field distribution,

SUMMARY OF THE INVENTION

The present invention, which addresses these needs, resides in an adapter for coupling a quasi-optic grid array assembly to a waveguide that has an internal cavity bounded by a wave-confining device and that guides a wave propagating in a longitudinal direction. The adapter translates the wave between the fundamental mode of the waveguide and a desired electromagnetic field distribution at the plane of the array assembly. The adapter comprises a first end, a second end and a wave-confining structure. The first end that is adapted to mate with an end of the waveguide and that defines a first aperture that substantially matches the size of the waveguide cavity at the end of the waveguide. The second end defines a second aperture that is larger than the first aperture. The wave-confining structure is disposed between the first aperture and second aperture and defines a wave-guiding cavity that guides a wave propagating along the longitudinal direction of signal propagation. The wave-confining structure includes means for creating a spatial discontinuity within the cavity of a predetermined size to create a desired field distribution. In one embodiment, this includes a first step configured within the cavity that is a predetermined distance from the first aperture. The spatial discontinuity is defined as a substantially abrupt change in cross-section of the wave-confining structure, which may simply be internal walls. Although application dependent, typically, the change in cross-section occurs preferably over less than ¼ of a wavelength. It will be understood by those skilled in the art that other changes (magnitude and shape) in cross-section are possible. Accordingly, the adapter of the present invention tends to be substantially more manufacturable and compact than the conventional techniques and devices.

More particularly, the first step in the internal walls of the adapter adjusts the size of the guiding cavity in the direction parallel to the electric field propagating in the waveguide, referred to herein the "E-plane." Alternatively, the first step may adjust the size of the guiding cavity in the direction perpendicular to both the direction of the electric field and the longitudinal direction of the wave propagation, referred to hereinafter as "H-plane." Preferably, however, the adapter of the present invention in includes at least two steps within the guiding cavity; one that adjusts the cavity size in the E-plane and another that adjusts the cavity size in the H-plane. The adapter of the present invention may further include at least one additional step in the E-plane within the adapter walls and one additional step in the H-plane within the adapter walls. All of these steps are configured to excite higher order modes within the adapter and to shape the field distribution of the signal at the second aperture.

In one preferred embodiment, the adapter of the present invention includes a grid array located at the second aperture of the adapter. This grid array assembly includes an active grid array bounded by a dielectric, which serves as a heat spreader. The grid array may be a grid amplifier, a grid oscillator or other type of active grid array. Moreover, the second aperture is sized such that the edges of the active array are spaced apart from the confining walls a predetermined distance in order to shape the field distribution incident at the second aperture.

In another more detailed aspect of the invention, an input feed device for an active quasi-optic grid array assembly, that expands the fundamental mode of a signal propagating longitudinally in a rectangular waveguide having an internal wave-confining cavity, to a multi-mode signal having a desired field distribution is disclosed. This device comprises: (1) an input defining a first aperture that substantially matches the size of the waveguide cavity and that is adapted to mate with the waveguide; (2) an output defining a second aperture that is adapted to contain the grid array; and (3) a wave-confining structure disposed between the input and output, defining an EM guiding cavity. The wave-confining structure includes a first step within the cavity that is a predetermined distance from the input and that expands the cavity by a predetermined size, thereby controlling the phase and amplitude distribution of the signal between the fundamental mode of the waveguide and higher-order modes to obtain a desired field distribution. The step enlarges the guiding cavity in the E-plane or H-plane. Preferably, however, the feed cavity includes one step that enlarges the cavity in the E-plane and a second step that enlarges the cavity in the H-plane. There may be additional steps within the cavity in order to obtain a desired field distribution at the output.

In yet another embodiment, an electromagnetic wave collector device that translates a multi-mode signal propagating from an active quasi-optic grid array assembly into the fundamental mode of a rectangular waveguide having an internal conducting cavity, is disclosed. The collector includes an input defining a first aperture adapted to contain the grid array, an output defining a second aperture that substantially matches the size of the waveguide cavity and that is adapted to mate with the waveguide, and a wave-conducting structure disposed between the input and output, defining an EM wave-guiding cavity.

The cavity includes first step in the E-plane or H-plane that is a predetermined distance from the input and that contracts the cavity by a predetermined size, thereby controlling the phase and amplitude distribution of the signal in order to convert the power in the higher-order modes of the signal into the fundamental mode from the grid array. More preferably at least two steps are included in the cavity, one in the E-plane and another in the H-plane. Additional steps within the cavity may be included in order to more closely approach the fundamental mode.

A method of transforming an electromagnetic signal between the fundamental mode of a standard rectangular waveguide at one end of a waveguide adapter having an internal cavity bounded by a wave-confining structure to a field distribution at the opposite end of the adapter that is desirable for a quasi-optic grid array assembly, is disclosed. The method comprises adjusting the size of internal walls of the adapter with at least one discontinuous step in the E-plane at a predetermined distance from the waveguide, and adjusting the size of internal wall of the adapter with at least one spatial discontinuity in the H-plane at a predetermined distance from the waveguide. The method may further include the steps of providing a grid array assembly, having a grid array and dielectric bounding the array, at the opposite end of the adapter and adjusting the normal distance between the edge of the grid array and the adapter wall at the opposite end to further determine the field distribution on the grid array.

DETAILED DESCRIPTION OF THE PREFERRED EMBODIMENTS

The invention disclosed here is an adapter or transition between the waveguide environment and the quasi-plane wave (quasi-TEM mode) environment in which the grid array components operate. Efficient operation of grid amplifiers requires an excitation beam that has a uniform phase and magnitude over the amplifier's area. Efficient operation also requires that a the output field distribution of the grid array (typically essentially uniform in amplitude and phase, although alternative distributions are possible) be strongly coupled to the fundamental mode of a waveguide structure, if the output of the grid array is to be recaptured into a guided wave environment (rather than radiated into free space).

As noted, single-mode rectangular waveguide operating in $TE_{10}$ mode gives an electric field distribution that varies sinusoidally in amplitude across its aperture. The waveguide adapter disclosed herein couples this fundamental $TE_{10}$ mode in a standard waveguide to higher-order modes in an oversized guide with desired amplitude and phase relationships, so as to provide efficient excitation of the grid array when used as an input feed. In reverse operation, the adapter serves as an efficient collector of output power when used as an output waveguide transition.

Figure 1:
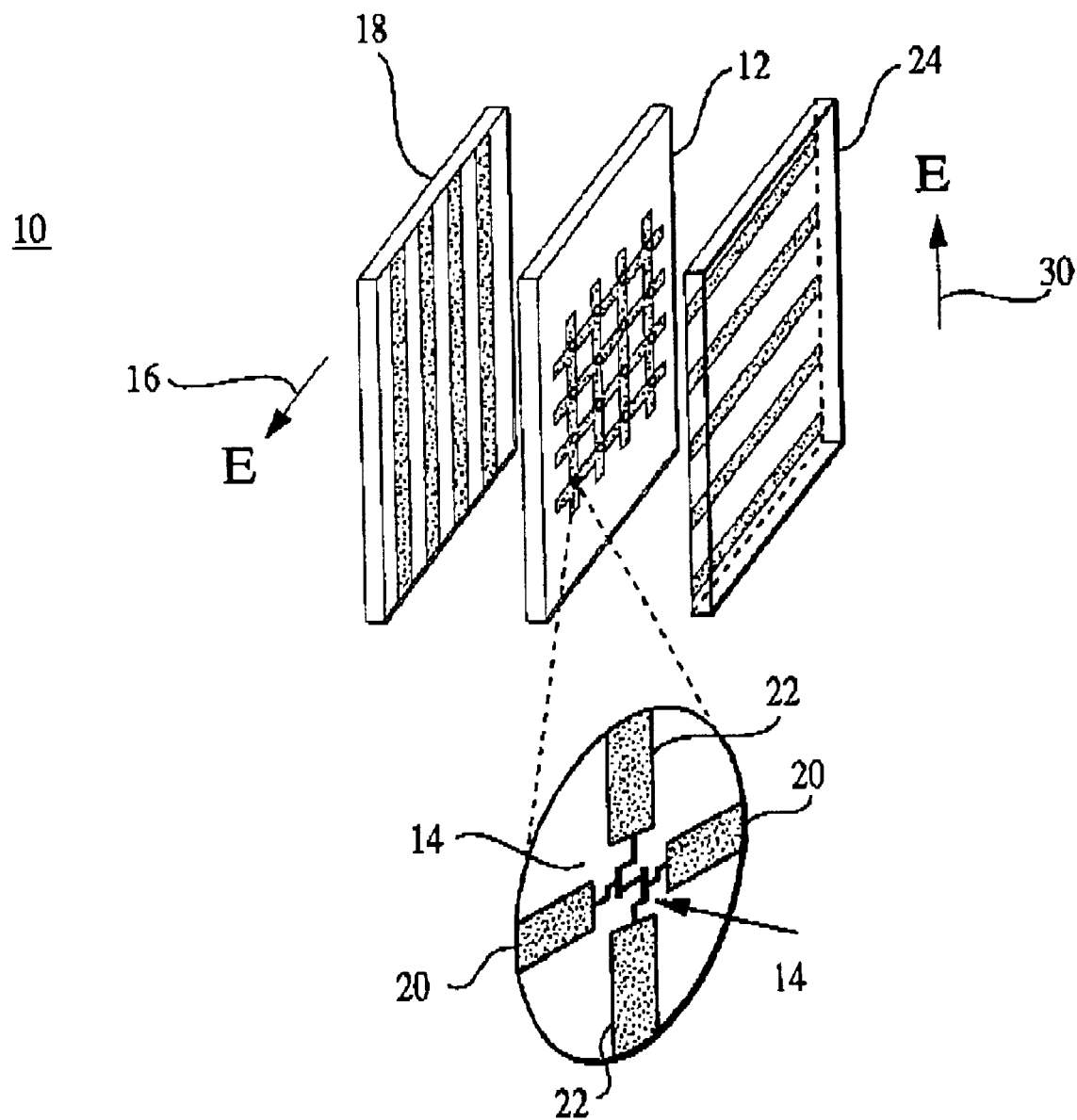
FIG. 1 is an exploded view of a conventional quasi-optic grid array with one of the differential pair unit cells in the array magnified.
Figure 2:
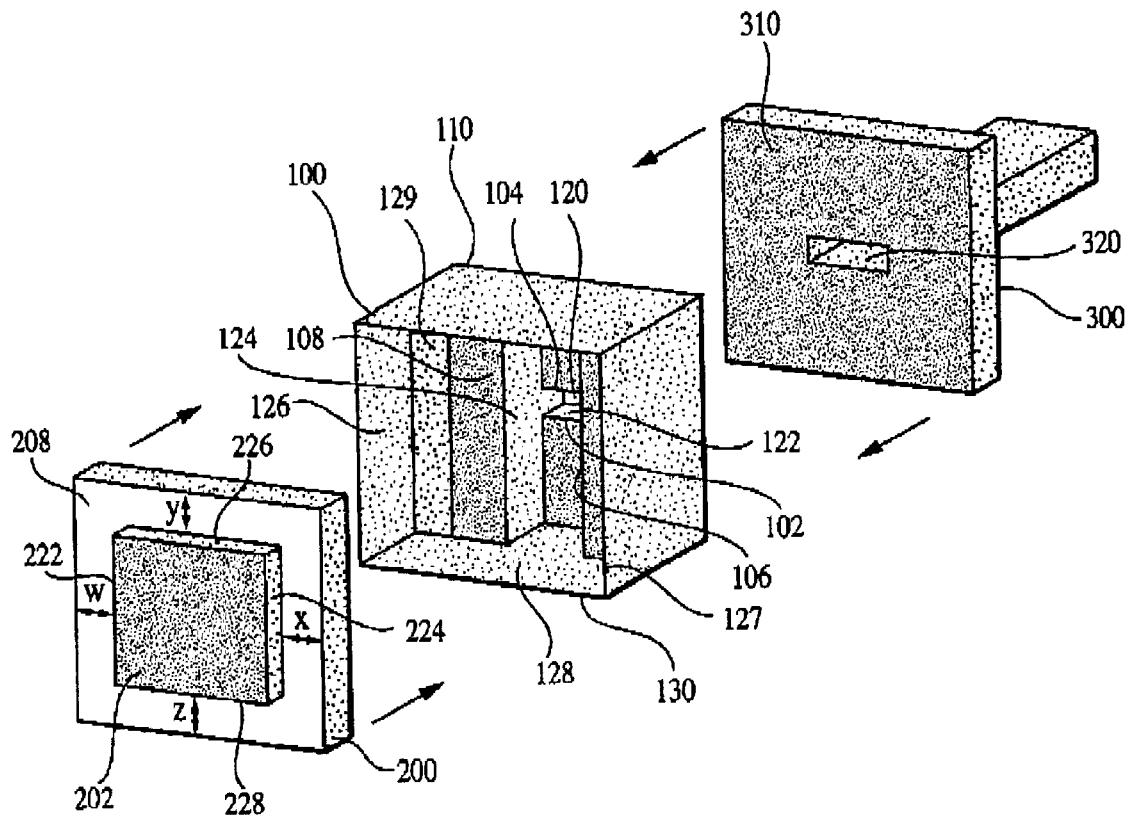
FIG. 2 is a perspective view of a waveguide adapter of the present invention shown with a rectangular waveguide in position to be assembled to it at one end and an active quasi-optic grid array assembly in position to be assembled into the adapter at one end.
Figure 3:
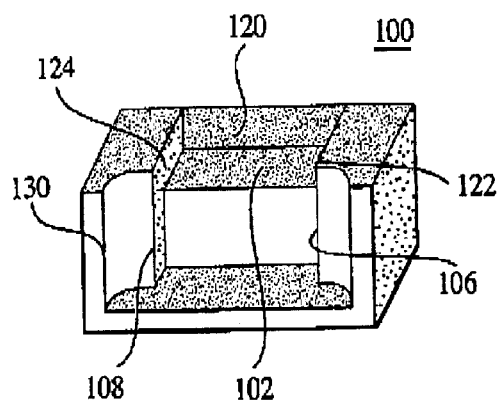
FIG. 3 is a perspective cutaway illustration of the adapter of the present invention shown with one step provided in the E-plane and one step in the H-plane.

FIG. 2 is a perspective view of one embodiment of the waveguide adapter 100 of the present invention shown with a conventional rectangular waveguide 300 at one end and a grid array assembly 200, comprising an active quasi-optic grid array 202 associated with a dielectric layer 208, at the other end, both in position to be assembled to the adapter. FIG. 3 is perspective cutaway illustration of a typical adapter 100 of the present invention, such as the one shown in FIG. 2. The first end 110 of the adapter of the present invention defines a first aperture 120 that is designed to match, or mate with, an aperture 320 at an end 310 of a typical rectangular waveguide 300 that propagates signals in the TE single mode. Steps 102, 104, 106 and 108 in both the horizontal and vertical planes expand the internal size of the guiding structure 100 from the standard fundamental single-mode waveguide size at the first aperture 120 to the oversized guide aperture defined by the second end 130 of the adapter that is equal to or larger than the size of the active array 202. These steps define the conducting walls 122, 124, 126 within which the EM signal propagates. As seen, steps 102 and 104 enlarge the guide (as viewed from the waveguide) in the direction parallel to the electric field in the standard guide and are thus referred to as "E-plane" steps. Steps 106 and 108 are perpendicular to both the electric field and the longitudinal direction of propagation, and are thus referred to as "H-plane" steps. Each step creates a spatial discontinuity within the cavity, which is a relatively abrupt change in the cross-section of the cavity and as defined above. However, the step need not be machined to create a "sharp" corner. As a rule of thumb, the step should create change in cross-section occur over less than a quarter of a wavelength of radiation and may differ depending on the specific application. Moreover, the number, placement and size of the steps control the amplitude and phase distribution at the plane of the grid array, or second end 130, and can be adjusted as desired.

In addition to the confining structure, or the walls, of the adapter, one or more sheets of dielectric 208 may be used to provide impedance matching between the modes excited in the oversized guide and the active array. In the embodiment shown in FIG. 2, one surface of a sheet of dielectric supports the grid array 202 and the entire grid array-dielectric assembly can be assembled into and contained by the second end 130 of the adapter 100. Typically, the number of propagating modes within the dielectrically loaded portion of the guide is larger than in the air-filled portion.

The steps excite higher-order modes within the guiding structure of the adapter 100. These modes may be either propagating or evanescent. The magnitude and phase of these excitations with respect to the fundamental mode are determined by the lateral size and longitudinal position of the steps. By controlling the magnitude and phase of these excitations, a conversion between the fundamental standard waveguide mode at aperture 120 and an approximation to a desired field distribution (e.g., uniform amplitude and phase) at the plane of the active array 130 is achieved. The number of higher order modes that may be independently controlled is determined by the number of steps used to expand from the standard guide to the oversized guide. A larger number of smaller steps can allow greater flexibility in tailoring the shape of the field distribution at the plane of the active array.

Moreover, when assembled, the distances, w, x, y and z from the edges 222, 224, 226, 228 of the active array, to the edges of the second end 130 of the adapter 100, in this case, the walls 126, 127, 128 and 129, is also important in determining the field distribution, and provides an additional design parameter for improving the distribution.

A first approximation to the step design can be made using a spatial Fourier series expansion in the modes available to propagate within the oversized guide. The magnitude and phase of the expansion coefficients depend on the size and longitudinal placement of the steps.

As noted, FIG. 2 is a particular illustration of an adapter configured as an input feed to a grid amplifier. That is, this adapter feeds a signal from a waveguide to a grid array such as a grid amplifier and with the amplifier providing a free space output. However, it should be understood that the present invention operated equally in the reverse mode. That is, the adapter of the present invention may operate as an efficient output waveguide collector or "mode contractor." In this embodiment, the grid array radiates in free space a multiple mode output power signal into the oversized adapter 100, which collects this free space signal and reduces the signal down to a signal mode TEM signal, via the adapter's steps that contract its internal cavity, for input to a standard TEM waveguide.

It should be understood that the internal wave-confining structure is typically electrically conducting walls but may alternatively be non-conducting.

Having thus described exemplary embodiments of the invention, it will be apparent that further alterations, modifications, and improvements will also occur to those skilled in the art. Further, it will be apparent that the present technique and system is not limited to use as a technique for adapting a signal on a waveguide to a desired distribution. It may be applied to any type of waveguide-to-grid array transition, whether the waveguide propagates exclusively in single mode or not, and whether the array is a grid amplifier, grid oscillator or other type of quasi-optic grid array structure. Accordingly, the invention is defined only by the following claims.

We claim:

1. An adapter for adapting a quasi-optic grid array to a waveguide having an internal cavity defined by a wave-confining device and that guides a wave propagating in a longitudinal direction, the adapter translating between the fundamental mode of the waveguide and a desired electromagnetic field distribution at the plane of the array, comprising:
    (a) a first end that is adapted to substantially mate with the waveguide and that defines a first aperture that substantially matches the size of the waveguide cavity and;
    (b) a second end defining a second aperture that is larger than the first aperture; and
    (c) a wave-confining structure disposed between the first end and second end, defining a wave-guiding cavity that guides a wave propagating along the longitudinal direction of signal propagation, including a first step configured within the cavity that is a predetermined distance from the first aperture and that creates a spatial discontinuity within the wave-guiding cavity of a predetermined size to create a desired field distribution.

2. The adapter of claim 1, wherein the first step adjusts the size of the guiding cavity in the direction parallel to the electric field propagating in the waveguide ("E-plane").

3. The adapter of claim 1, wherein the first step adjusts the size of the guiding cavity in the direction perpendicular to both the direction of the electric field and the longitudinal direction of the wave propagation ("H-plane").

4. The adapter of claim 2, further including a second step within the guiding cavity that adjusts the cavity size in the H-plane.

5. The adapter of claim 4, further including at least one additional step in the E-plane within the adapter guiding cavity and one additional step in the H-plane within the cavity, all steps being configured to excite higher order modes within the adapter and to shape the field distribution of the signal at the second aperture.

6. The adapter of claim 1, wherein the second end of the adapter contains the grid array.

7. The adapter of claim 1, wherein the second end of the adapter contains the grid array that is bounded by a dielectric sheet.

8. The adapter of claim 1, wherein the second end of the adapter contains a grid amplifier that is bounded by a dielectric sheet.

9. The adapter of claim 7, wherein the dielectric is a heat spreader.

10. The adapter of claim 7, wherein the second aperture is sized such that the edges of the active array are spaced apart from the wave-confining structure at the second end a predetermined distance in order to shape the field distribution incident at the second aperture.

11. An input feed device for an active quasi-optic grid array, that expands the fundamental mode of a signal propagating longitudinally in a rectangular waveguide having an internal wave-confining cavity, to a multi-mode signal having a desired field distribution, comprising:
    (a) an input defining a first aperture that substantially matches the size of the waveguide cavity and that is adapted to mate with the waveguide;
    (b) an output defining a second aperture that is adapted to contain the grid array; and
    (c) a wave-confining structure disposed between the input and output, defining a wave-guiding cavity, and including
        a first step within the cavity that is a predetermined distance from the input and that expands the cavity by a predetermined size, thereby controlling the phase and amplitude distribution of the signal between the fundamental mode of the waveguide and higher-order modes to obtain a desired field distribution.

12. The device of claim 11, wherein the step enlarges the EM guiding cavity in the E-plane.

13. The device of claim 11, wherein the step enlarges the EM guiding cavity in the H-plane.

14. The device of claim 13, further including a second step that enlarges the EM guiding cavity in the H-plane.

15. The device of claim 14, further including additional steps within the EM guiding cavity in order to obtain a desired field distribution at the output.

16. An EM wave collector device that translates a multi-mode signal propagating from an active quasi-optic grid array into the fundamental mode of a rectangular waveguide having an internal conducting cavity, comprising:
    (a) an input defining a first aperture adapted to contain the grid array;
    (b) an output defining a second aperture that substantially matches the size of the waveguide cavity and that is adapted to mate with the waveguide; and
    (c) an internal conducting structure disposed between the input and output, defining a wave-guiding cavity, and including
        a first step within the cavity that is a predetermined distance from the input and that contracts the cavity by a predetermined size, thereby controlling the phase and amplitude distribution of the signal in order to convert the power in the higher-order modes of the signal into the fundamental mode from the grid array.

17. The device of claim 16, wherein the step contracts the EM guiding cavity in the E-plane.

18. The device of claim 17, wherein the step contracts the EM guiding cavity in the H-plane.

19. The device of claim 17, further including a second step that contracts the cavity in the H-plane.

20. The device of claim 19, further including additional steps within the cavity in order to obtain a first order field distribution at the output.

21. A method of transforming an electromagnetic signal between the fundamental mode of a standard rectangular waveguide at one end of a waveguide adapter having an internal cavity bounded by a wave-confining structure to a field distribution that is desirable for a quasi-optic grid array at the opposite end of the waveguide adapter, comprising:
    adjusting the size of the cavity of the adapter with at least one spatial discontinuity in the E-plane at a predetermined distance from the waveguide.

22. The method of claim 21, further including adjusting the size of the cavity of the adapter with at least one spatial discontinuity in the E-plane at a predetermined distance from the waveguide.

23. The method of claim 21, further including providing the grid array, with a dielectric bounding the array, at the opposite end of the adapter and adjusting the normal distance between the edge of the grid array and the adapter at the opposite end to further determine the field distribution on the grid array.

24. An adapter for adapting a quasi-optic grid array to a waveguide having an internal cavity defined by a wave-confining device and that guides a wave propagating in a longitudinal direction, the adapter translating between the fundamental mode of the waveguide and a desired electromagnetic field distribution at the plane of the array, comprising:

(a) a first end that is adapted to substantially mate with the waveguide and that defines a first aperture that substantially matches the size of the waveguide cavity and;

(b) a second end defining a second aperture that is larger than the first aperture; and (c) means disposed between the first end and second end, defining a wave-guiding cavity for guiding a wave propagating along the longitudinal direction of signal propagation, the means including means configured within the cavity that is a predetermined distance from the first aperture for creating a spatial discontinuity within the wave-guiding cavity of a predetermined size to create a desired field distribution at the quasi-optic grid array.

25. A device, comprising:

a waveguide adapter to guide an electromagnetic wave, having a first end aperture, a second end aperture with a dimension different from said first end aperture, and a waveguide cavity connected between said first and said second end apertures to guide the electromagnetic wave;

a quasi-optic grid array smaller than said first end aperture and coupled to said first end aperture and operable to amplify or produce electromagnetic energy;

a dielectric layer larger than said grid array and positioned between said grid array and said first end aperture to match an impedance between an electromagnetic field at said grid array and an electromagnetic field at said first end aperture; and a waveguide having a waveguide end opening that substantially conformingly connects to said second end aperture, wherein said waveguide cavity in said waveguide adapter includes a first step structure to produce a first spatial discontinuity in said waveguide cavity in a first direction parallel to an electric field in said waveguide, and a second step structure to produce a second spatial discontinuity in the waveguide cavity in a second direction perpendicular to said first direction to produce a desired field distribution at said grid array.

26. The device as in claim 25, wherein the spacing from each side of said grid array to an adjacent edge of said first end aperture of said waveguide adapter is determined by said desired field distribution at said grid array.

27. The device as in claim 25, wherein each step structure is configured to produce a change in a cross section of said waveguide cavity less than one quarter of one wavelength of the electromagnetic wave.

* * * * *

UNITED STATES PATENT AND TRADEMARK OFFICE
CERTIFICATE OF CORRECTION

PATENT NO. : 6,542,662 B2
DATED : April 1, 2003
INVENTOR(S) : Chun-Tung Cheung and David B. Rutledge It is certified that error appears in the above-identified patent and that said Letters Patent is hereby corrected as shown below:

<u>Column 1,</u>
Line 16, before "BACKGROUND OF THE INVENTION" and after the words "U.S. Army," please add the following:

-- and Grant No. N66001-96-C-8627 awarded by NAVY-SPAWAR Systems Center. --

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,542,662 B2
DATED         : April 1, 2003
INVENTOR(S)   : Chun-Tung Cheung and David B. Rutledge It is certified that error appears in the above-identified patent and that said Letters Patent is hereby corrected as shown below:

<u>Column 8,</u>
Line 21, replace "The device of claim 13" with -- The device of claim 12 --.
Line 46, replace "The device of claim 17" with -- The device of claim 16 --.
Line 64, should read -- The method of claim 21, further including adjusting the size of the cavity of the adapter with at least one spatial discontinuity in the H-plane at a predetermined distance from the waveguide --.

Signed and Sealed this

Eleventh Day of April, 2006

JON W. DUDAS
*Director of the United States Patent and Trademark Office*